US005387551A

United States Patent [19]

Mizoguchi et al.

[11] Patent Number: 5,387,551

[45] Date of Patent: Feb. 7, 1995

[54] METHOD OF MANUFACTURING FLAT INDUCTANCE ELEMENT

[75] Inventors: Tetsuhiko Mizoguchi, Yokohama; Atsuhito Sawabe, Yokosuka; Hiromi Fuke, Kawasaki; Toshiro Sato, Yokohama, all of Japan

[73] Assignee: Kabushiki Kaisha Toshiba, Kawasaki, Japan

[21] Appl. No.: 26,027

[22] Filed: Mar. 4, 1993

[30] Foreign Application Priority Data

Mar. 4, 1992 [JP] Japan .................................. 4-047217

[51] Int. Cl.$^{6}$ .............................................. H01L 21/265

[52] U.S. Cl. ..................................... 437/209; 437/189; 437/195; 148/DIG. 12

[58] Field of Search ............... 437/209, 188, 195, 189, 437/62; 257/531; 148/DIG. 12

[56] References Cited

U.S. PATENT DOCUMENTS

| | | | |
|---|---|---|---|
| 3,614,554 | 10/1971 | Shield | 257/531 |
| 4,785,345 | 11/1988 | Rawls et al. | 257/531 |
| 4,959,631 | 9/1990 | Hasegawa et al. | |
| 5,091,266 | 2/1992 | Omata | 428/611 |
| 5,095,351 | 3/1992 | Andoh et al. | 257/531 |
| 5,102,821 | 4/1992 | Moslehi | 437/62 |
| 5,168,078 | 12/1992 | Reisman et al. | 437/188 |
| 5,227,659 | 7/1993 | Hubbard | 257/531 |
| 5,232,870 | 8/1993 | Ito et al. | 148/DIG. 12 |
| 5,260,233 | 11/1993 | Buti et al. | 437/188 |

FOREIGN PATENT DOCUMENTS

| | | | |
|---|---|---|---|
| 49-41849 | 4/1974 | Japan . | |
| 57-11106 | 7/1982 | Japan . | |
| 60-225449 | 11/1985 | Japan | 257/531 |
| 61-161747 | 7/1986 | Japan | 257/531 |
| 3-19358 | 1/1991 | Japan | 257/531 |

OTHER PUBLICATIONS

Soohoo, IEEE Transactions on Magnetics, vol. Mag–15, No. 6, Nov. 1979, pp. 1803–1805. "Magnetic Thin Film Inductors for Integrated Circuit Applications".

Kawabe, et al., IEEE Transactions on Magnetics, vol. Mag–20, No. 5, Sep. 1984, pp. 1804–1806. "Planar Inductor".

*Primary Examiner*—Brian E. Hearn
*Assistant Examiner*—Kevin M. Picardat
*Attorney, Agent, or Firm*—Oblon, Spivak, McClelland, Maier & Neustadt

[57] ABSTRACT

A method of manufacturing a planar inductance element, including the steps of forming a thermal oxide film, a magnetic film, a first insulating interlayer, a planar coil, and a second insulating interlayer on a first semiconductor substrate, forming an insulating film and a magnetic film on a second semiconductor substrate, and adhering the first and the second semiconductor substrates such that the coil side of the first semiconductor substrate faces the magnetic film side of the second semiconductor substrate. According to this method, a stress generated by stacking thin films can be reduced compared with that of a conventional inductance element. Therefore, a high-frequency loss can be reduced, and a quality coefficient Q can be increased.

14 Claims, 12 Drawing Sheets

METHOD OF MANUFACTURING FLAT INDUCTANCE ELEMENT

BACKGROUND OF THE INVENTION

1. Field of the Invention

The present invention relates to a method of manufacturing a very small and thin planar inductance element.

2. Description of the Related Art

In recent years, miniaturization of various electronic equipments has been proceeding. Accordingly, a volume ratio of a power supply to the entire electronic equipment tends to increase because of the following reason. That is, although various circuits have been integrated as an LSI, miniaturization and lightening of inductance elements such as an inductor and a transformer which are indespensable circuit elements for a power supply have not been realized.

Therefore, various attempts have been performed to make inductance elements planar to miniatualize them. For example, a planar inductor having the following structure is known. That is, a spiral planar coil is patterned by wet etching a conductive film formed on an insulating substrate such as a polyimide film, an insulating layer is placed on a spiral planar coil, and both the surfaces of the resultant structure are sandwiched by magnetic members such as ferrite plates and amorphous alloy foils. Similarly, a transformer having the following structure is known. That is, a primary and a secondary spiral coils are formed through an insulating layer, both the surfaces of the resultant structure are sandwiched by insulating layers, and magnetic members are formed on the insulating layers, respectively.

In addition, there is an attempt to manufacture a planar inductance element using only the same thin film process as that used in the manufacture of a semiconductor device. For example, a planar inductor is manufactured as follows. An underlying insulating film, a magnetic film, and an insulating interlayer are sequentially formed on the surface of an Si substrate. A conductive film is formed on the insulating interlayer, and then planar coils are formed by photolithography. An insulating film for burying between the lines of the planar coils and covering the upper surface thereof is formed, and a magnetic film is formed thereon. Further, the magnetic film is processed and then is annealed in a magnetic field, and the characteristics of the resultant elements are evaluated. Thereafter, the resultant elements are diced.

Also, a planar transformer is manufactured as follows. That is, an underlying insulating film, a magnetic film, and an insulating interlayer are sequentially formed on the surface of an Si substrate. A conductive film is formed on the insulating interlayer, primary planar coils are formed by photolithography. An insulating interlayer for burying between the lines of the primary planar coils and covering the upper surface thereof is formed. A conductive film is formed on the insulating interlayer, and the secondary planar coils are formed by photolithography. An insulating interlayer for burying between the lines of the secondary planar coils and covering the upper surface thereof is formed, and a magnetic film is formed thereon. Further, the magnetic film is processed and then is annealed in a magnetic field, and the characteristics of the resultant elements are evaluated. Thereafter, the resultant elements are diced.

However, since the conventional methods have the following many drawbacks, planar inductance elements are not practically manufactured.

First, in the manufacture of a planar inductance element using a thin film process, a technique of regulating a stress generated by thermal hysteresis caused by stacking thin films, and a technique of burying an insulator to secure the insulation between the lines of coils cannot be established. For this reason, the yield of manufactured inductance elements is decreased, thereby increasing the production cost. In addition, since a stress remains in the inductance element manufactured by the method described above, magnetic anisotropic dispersion occurs due to a so-called reverse magnetostrictive effect. As a result, a high-frequency loss is increased, the quality coefficient Q as an inductance element is decreased, and the planar inductance element cannot be practically used.

Second, in a planar inductance element formed by a method using a planar coil formed by patterning a conductive film on an insulating substrate such as a polyimide film, and magnetic films such as amorphous alloy foils and ferrite plates, a decrease in thickness and miniaturization of the inductance element are limited, and intervals between the lines of a coil cannot be decreased. For this reason, the inductance is decreased, and the quality coefficient Q is undesirably decreased.

As described above, planar inductance elements manufactured by the above conventional methods cannot realize an excellent frequency characteristic necessary for miniaturization of inductance element.

SUMMARY OF THE INVENTION

It is an object of the present invention to provide a method of easily manufacturing a very small and thin planar inductance element having high cost performance.

According to the present invention, there is provided a method of manufacturing a planar inductance element in which a planar coil and a substrate having a magnetic film formed thereon are independently formed, and they are adhered to each other such that the magnetic film on the substrate faces the planar coil.

By using the method according to the present invention, a very small and thin planar inductance element having a high efficiency and a large capacity can be easily manufactured at low cost. The present invention can considerably contribute to decreases in size and weight of electronic equipments mainly used as portable equipments.

DETAILED DESCRIPTION OF THE PREFERRED EMBODIMENTS

Figure 1:
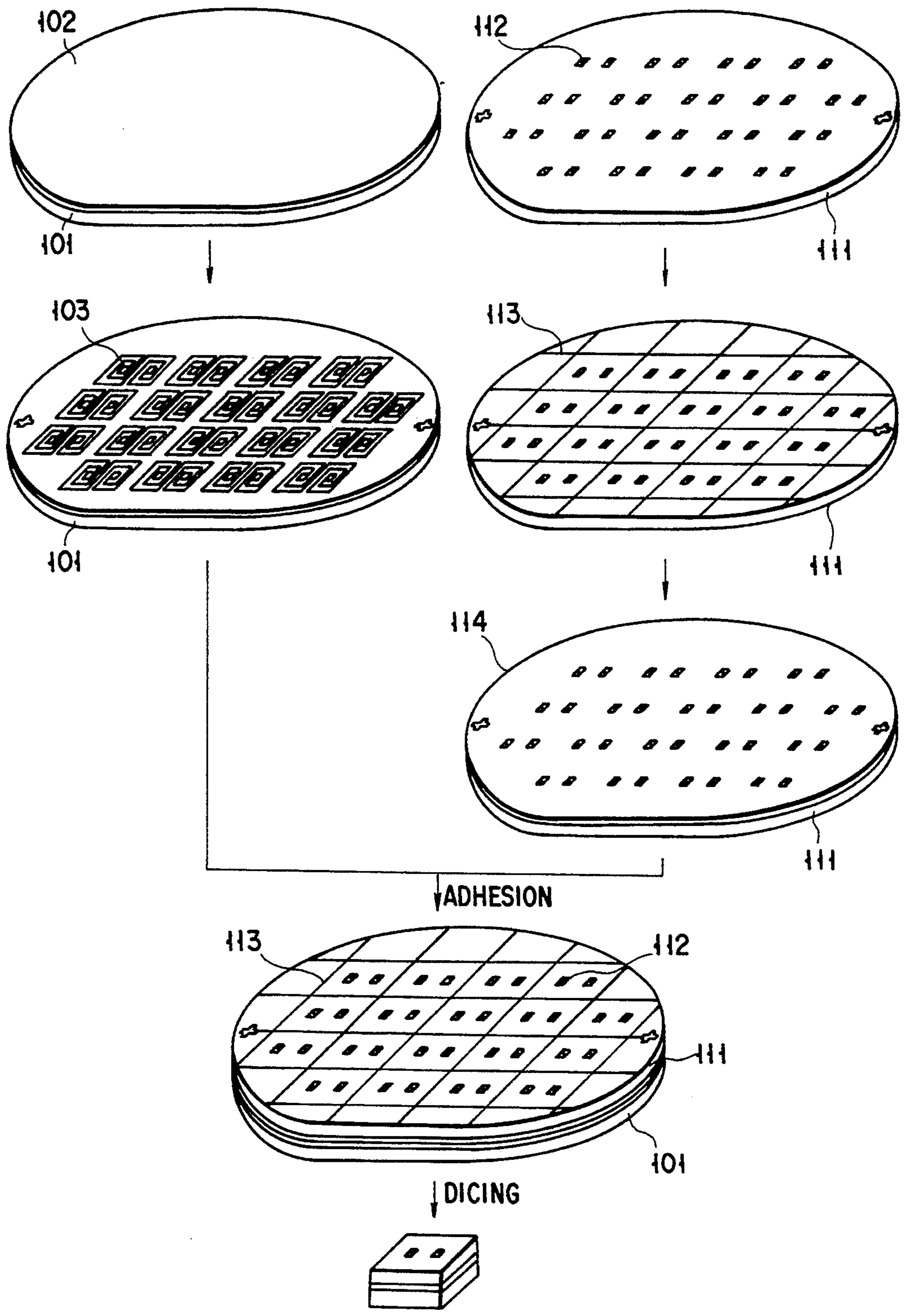
FIG. 1 is a view for explaining a method of manufacturing a planar inductor according to the present invention such that a planar coil is formed on one silicon substrate, a magnetic film is formed on the other silicon substrate, and both the silicon substrates are adhered to each other.

In the present invention, various patterns such as a spiral pattern and a meander pattern can be used as the patterns of planar coils. However, a spiral pattern is most suitable for increasing inductance.

These planar coils are formed by the following methods. (1) A conductive film is formed on a substrate by a thin film process, and the conductive film is patterned by a micropatterning technique to form a planar coil. Note that, when an element whose planar coil has both surfaces sandwiched by magnetic films is to be manufactured, a magnetic film and an insulating film are formed on a substrate on which the planar coil is formed, and then a planar coil may be formed. (2) A conductive film is formed on an insulating substrate such as a polyimide film, and then the conductive film is patterned by wet etching to form a planar coil. (3) A copper foil and an insulating layer are stacked, the resultant structure is wound like a roll, and the roll is sliced to form a planar coil.

In addition, the number of planar coils can be variously selected in accordance with applications. When a plurality of planar coils are used, the arrangement of the planar coils is not particularly limited. The arrangement can be arbitrarily selected from the following: for example, all planar coils are stacked; some planar coils are stacked and the remaining planar coils are laterally arranged; all planar coils are laterally arranged. When a plurality of planar coils are used, these coils may be formed by one or more methods selected from the above three methods.

In the present invention, a magnetic film is formed on a substrate independently of a planar coil. As the substrate, a polycrystalline insulating substrate, a single crystalline insulating substrate, an organic material such as polyimide, a substrate consisting of an amorphous material such as glass, or a substrate consisting of a ceramic material such as $Al_2O_3$ and AlN is selected in accordance with applications. More specifically, a semiconductor substrate consisting of Si or GaAs or an oxide substrate consisting of $SiO_2$ or MgO is used. As the magnetic film, an amorphous alloy film having a small iron loss at a high frequency, an Fe-based magnetic film having a large saturation magnetization, a multilayered film formed by stacking two or more types of magnetic films, a multilayered film formed by stacking a magnetic film and an insulating film, an $Fe_8N$ epitaxial film having a magnetization close to 3T, an oxide magnetic film (ferrite film or the like) having excellent high-frequency characteristic although it has a small magnetization, or the like is used in accordance with applications.

These magnetic films may be used as formed or may be annealed to decrease coercive forces. In addition, magnetic anisotropy of the magnetic films may be controlled by the following various methods. (1) A single crystalline material is used as a substrate material, and a single crystalline magnetic film is formed by epitaxial growth on the substrate to introduce magnetic anisotropy to the magnetic film. (2) An amorphous alloy film is formed on a substrate, and the amorphous alloy film is annealed in a magnetic field to introduce magnetid anisotropy to the amorphous alloy film. (3) An energy beam (e.g., a photon beam such as a laser beam, or a particle beam such as an ion beam) is irradiated on a magnetic film to introduce magnetid anisotropy to the magnetic film.

In the present invention, the substrate on which the magnetic film is formed as described above is adhered to one surface (or both the surfaces) of the planar coil such that the magnetic film faces the planar coil, thereby manufacturing a planar inductance element.

In addition, when a planar transformer is to be manufactured, a planar coil is formed through an insulating film on a magnetic film formed on a substrate, and the substrate is adhered to the planar coil.

Note that the substrate and the planar coil are insulated from each other in principle when the substrate is an insulating material and a semiconducting material. As the insulating film, the following can be used: that is, a very thin polyimide film having a thickness of several $\mu m$, an insulating film having a thickness of about 1 $\mu m$ and formed on the planar coil or the magnetic film by a thin film process, a film formed by coating a fluid resist and baking it to solidify, or a thermoplastic resin used for thermal compression bonding.

A method according to the present invention will be described below with reference to the accompanying drawings.

FIG. 1 is a view for explaining a method of manufacturing planar inductors in which planar coils are formed on one silicon substrate, a magnetic film is formed on the other substrate, and they are adhered to each other.

First, a thermal oxide film (not shown), a magnetic film 102, and an insulating interlayer (not shown) are sequentially formed on a first Si substrate 101. A conductive film is formed on the insulating interlayer, and then planar coils 103 are formed by photolithography. In addition, an insulating interlayer (not shown) for burying between the lines of the planar coils and covering the upper surface thereof is formed. Contact holes for the terminals of the planar coils are formed in the insulating interlayer. An electrode metal is buried in the contact holes, and wires are formed as needed.

On the other hand, a thermal oxide film (not shown) is formed on a second silicon substrate 111. Through holes 112 are formed in the silicon substrate 111 at positions corresponding to the terminal positions of the planar coils on the first Si substrate. An electrode metal is buried in the through holes 112 and is flattened. Scribe lines are formed on the substrate 111. A magnetic film 114 is formed on the lower surface of the substrate 111. In the above steps, as needed, the insulating film is flattened, and the magnetic film is annealed in a magnetic field.

The two Si substrates 101 and 111 obtained as described above are adhered to each other while the Si substrates are aligned with each other, and the resultant structure is diced to manufacture planar inductors. In addition, the characteristics of the planar inductors are evaluated. Note that active elements may be formed on the first or second silicon substrate in advance.

Figure 2:
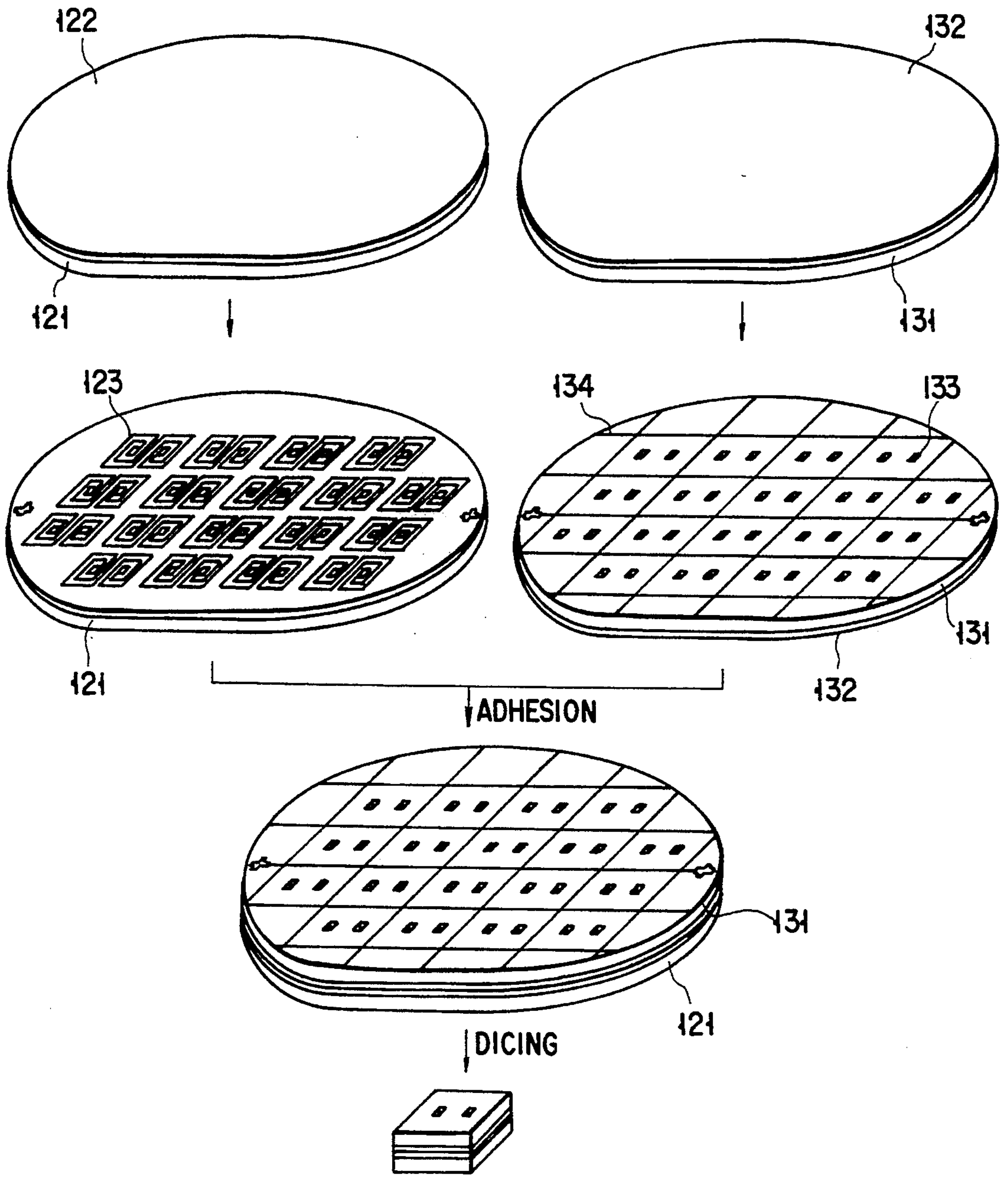
FIG. 2 is a view for explaining a method of manufacturing a planar inductor according to the present invention such that a planar coil is formed on one organic-material-based substrate, a magnetic film is formed on the other organic-material-based substrate, and both the organic-material-based substrates are adhered to each other.

FIG. 2 shows a method of manufacturing a planar inductor in which organic-material-based substrates are used in place of the silicon substrates in FIG. 1. As in FIG. 1, a magnetic film 122, an insulating interlayer, and planar coils 123 are formed on a first organic-material-based substrate 121. In addition, an insulating interlayer for burying between the lines of the planar coils and covering the upper surface thereof is formed. Contact holes for the terminals of the planar coils are formed in the insulating interlayer. An electrode metal is buried in the contact holes, and a wiring layer is formed as needed. On the other hand, a magnetic film 132 is formed on an second organic-material-based substrate 131. Through holes 133 are punched out in the substrate 131. Scribe lines 134 are formed on the surface opposite to the surface on which the magnetic film 132 is formed. The two substrates 121 and 131 are adhered to each other while the substrates are aligned with each other, and the resultant structure is diced to manufacture planar inductors.

Figure 3:
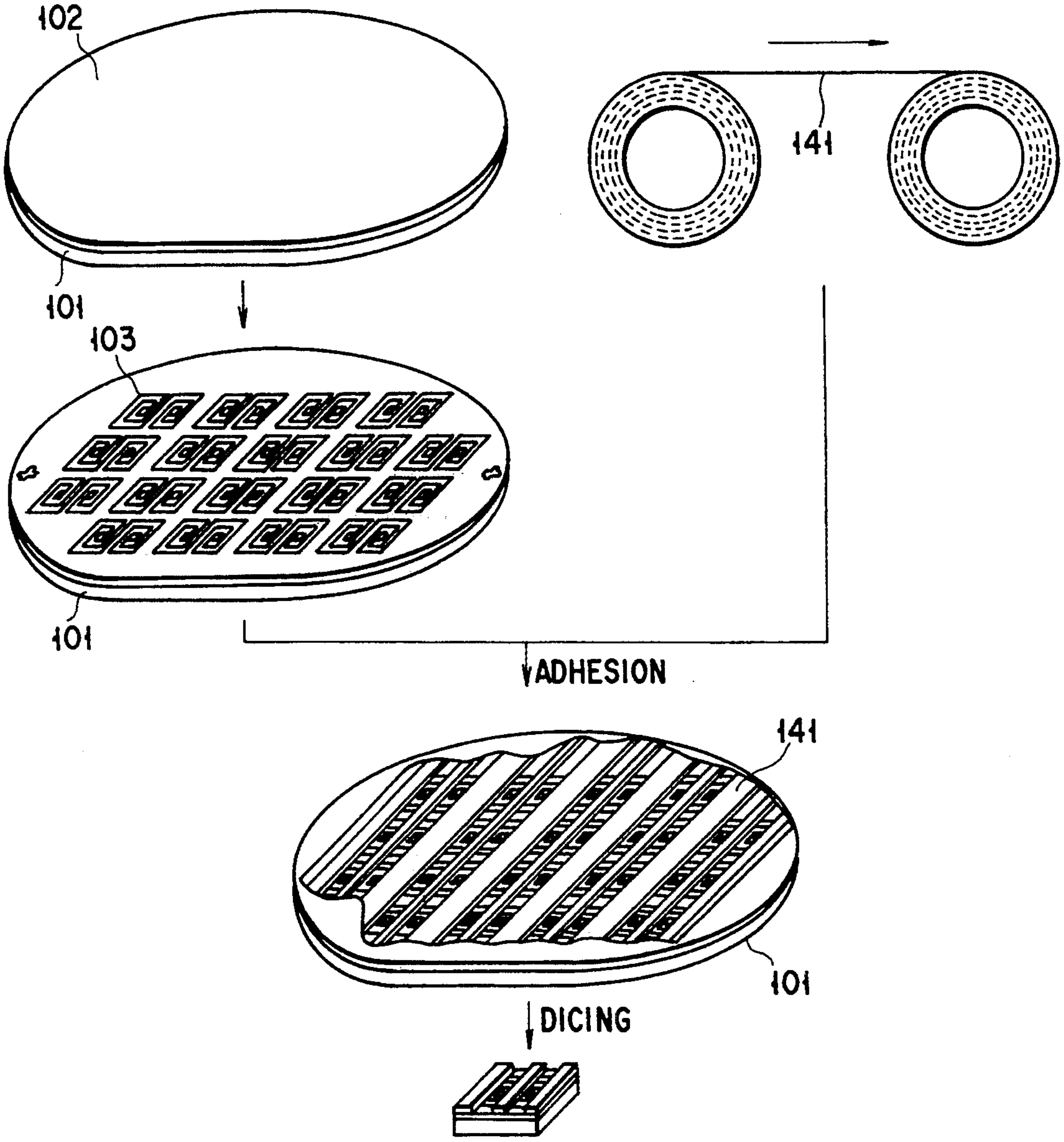
FIG. 3 is a view for explaining a method of manufacturing a planar inductor according to the present invention such that a planar coil is formed on a silicon substrate, a magnetic film is formed on an insulating tape, and the insulating tape is adhered to the silicon substrate.

FIG. 3 shows a method of manufacturing a planar inductor in which an insulating tape is used. As in FIG. 1, a thermal oxide film, a magnetic film 102, and an insulating interlayer are sequentially formed on an Si substrate 101. A conductive film is formed on the insulating interlayer, and then planar coils 103 are formed by photolithography. In addition, an insulating interlayer for burying between the lines of the planar coils and covering the upper surface thereof is formed. Contact holes for the terminals of the planar coils are formed in the insulating interlayer. An electrode metal is buried in the contact holes, and wires are formed as needed. On the other hand, a magnetic film (not shown) is formed on an insulating tape 141 having terminal holes, and the tape is cut into pieces each having a predetermined length. The insulating tapes 141 are adhered to the planar coils 103 on the Si substrate 101, and then the resultant structure is diced.

Figure 4:
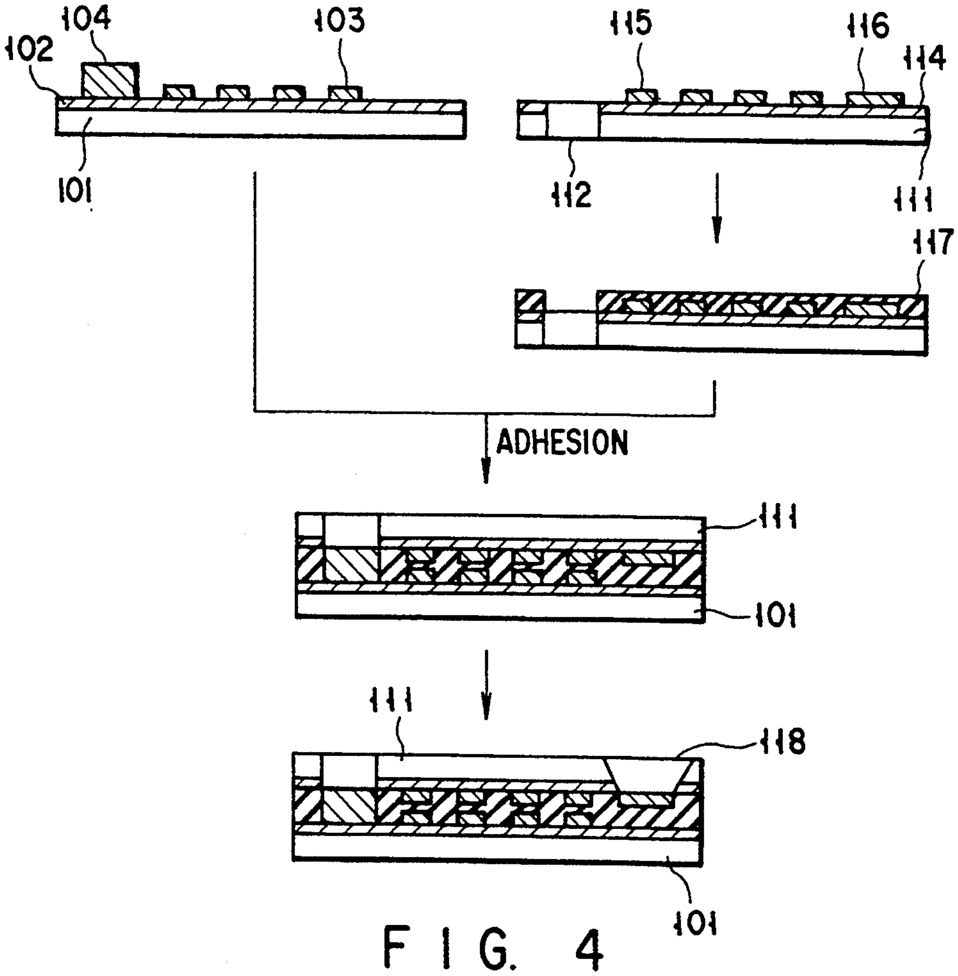
FIG. 4 is a view for explaining a method of manufacturing a planar transformer according to the present invention.

When a planar transformer is to be formed by the method as described in FIG. 1, a method of forming through holes for terminals will be described below with reference to FIG. 4. Note that some insulating films are not shown in FIG. 4. A thermal oxide film, a magnetic film 102, and an insulating interlayer are sequentially formed on a first Si substrate 101. A primary planar coil 103 is formed on the insulating interlayer. In addition, an electrode 104 connected to the planar coil 103 is formed. On the other hand, a thermal oxide film is formed on the second silicon substrate 111, and a through hole 112 is formed in the thermal oxide film and the second silicon substrate 111. The magnetic film 114 is formed on the substrate 111, and a secondary planar coil 115 and an electrode 116 are formed on the substrate 111 through an insulating interlayer. In addition, an insulating interlayer 117 is formed. The two silicon substrates 101 and 111 are adhered to each other while the substrates are aligned with each other. Further, a through hole 118 is formed at a position corresponding to the position of the electrode 116 on the second silicon substrate 111.

In the present invention, the relative positional relationship between the planar coil and the magnetic film is not particularly limited. However, when the planar coil and the magnetic film are arranged such that the magnetic flux generated by the planar coil is almost perpendicular to the direction of the magnetization of the magnetic film, and only the rotation of magnetization is used in a magnetization process, the characteristics, more particularly, high-frequency characteristics as an inductance element can be advantageously improved.

According to the method of the present invention, even when a thin film process is used, a planar coil and a magnetic film are respectively formed on different substrates, so that the numbers of thin films respectively stacked on the different substrates are decreased compared with those of the prior art. For this reason, a stress generated by stacking the thin films can be decreased, an internal stress remaining after the element is manufactured can be decreased, and the dispersion of magnetic anisotropy caused by a reverse magnetostrictive effect does not easily occur. Therefore, the yield of manufactured inductance elements can be increased. In addition, a high-frequency loss can be reduced, and the quality coefficients Q as the inductance elements can be increased.

Figure 5:
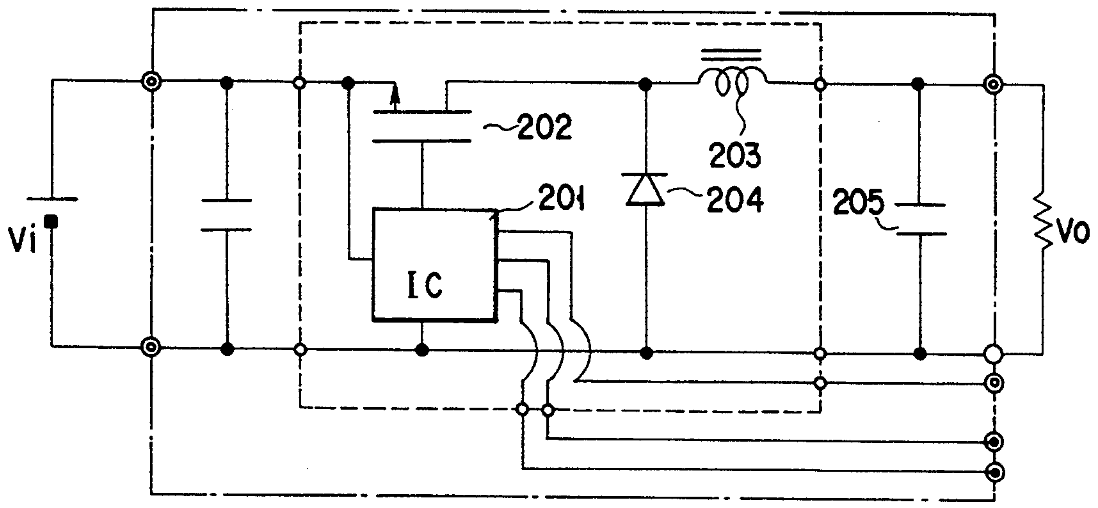
FIG. 5 is a circuit diagram showing a DC—DC converter.

An inductance element and an active element can be formed on one chip by the method of the present invention, and the chip can be applied to a microelectronic power supply or the like. FIG. 5 is a circuit diagram showing a stabilized power supply having a DC—DC converter manufactured by the method of the present invention. In this circuit, the ON time of a power MOS transistor 202 is controlled by a control IC 201, an output from an input DC power supply is converted into a high-frequency output, and the high-frequency output is converted into a DC output by a rectifying/smoothing circuit constituted by an inductor 203, a diode 204, and a capacitor 205, thereby stabilizing the DC output.

A portion surrounded by a broken line in FIG. 5 is formed as one chip, and a portion surrounded by a dashed line in FIG. 5 is formed as one package.

EXAMPLES

Examples of the present invention will be described below with reference to the accompanying drawings.

EXAMPLE 1

Figure 6A:
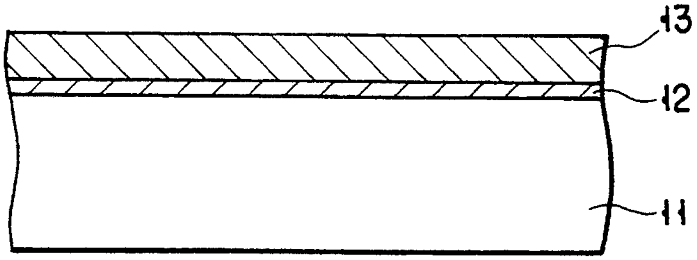
FIGS. 6A to 6D are sectional views showing the steps in manufacturing a substrate having a spiral coil in Example 1 of the present invention.
Figure 6B:
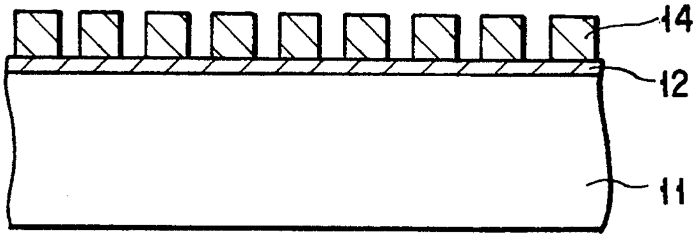
Figure 6C:
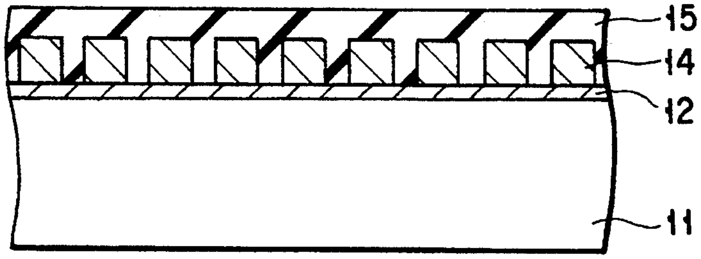
Figure 6D:
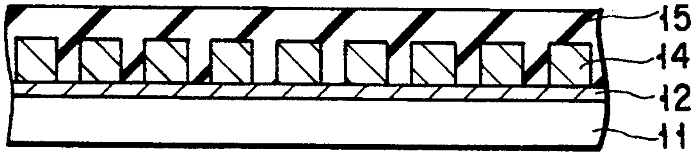

As shown in FIG. 6A, a thermal oxide film 12 is formed on an Si substrate 11. An Al film 13 having a thickness of 10 μm is formed on the thermal oxide film 12 by sputtering. As shown in FIG. 6B, the Al film 13 is processed by using a micropatterning technique to form a pattern having units each of which is constituted by a 5-mm square spiral coil 14 having a line width of 10 μm, a line space of 5 μm, and the number of turns of 30. As shown in FIG. 6C, a polyimide film 15 is buried between the lines of the coils and thermally set. As shown in FIG. 6D, the lower surface of the Si substrate 11 is sliced to have a thickness of 10 μm. Thereafter, the resultant structure is diced into every unit to form an Si substrate with a 5-mm square spiral coil having a total thickness of 14 μm.

Figure 7A:
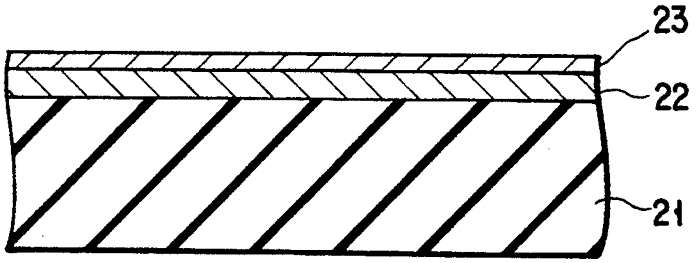
FIGS. 7A to 7B are sectional views showing the steps in manufacturing a planar inductor and a substrate having a magnetic film in Example 1 of the present invention.

As shown in FIG. 7A, an single crystalline MgO substrate 21 having a surface of (100) plane is used as another substrate, and an Fe film 22 serving as a magnetic film is formed on the MgO substrate 21 by ion-beam sputtering. An $SiO_2$ film 23 having a thickness of 1 μm is formed on the Fe film 22 by sputtering. As for the relationship of orientations between the magnetic film and the substrate, Fe (100) is parallel to MgO (100), and Fe <100> is parallel to MgO <110>. It is found from this relationship that the Fe film 22 is epitaxially grown on the MgO substrate 21. The Fe film 22 has a saturation magnetization of 21 kG and a coercive force of 1.0 Oe. The resultant structure is diced along straight lines parallel to the <100> direction of the crystal to form 5.5-mm square magnetic films.

Figure 7B:
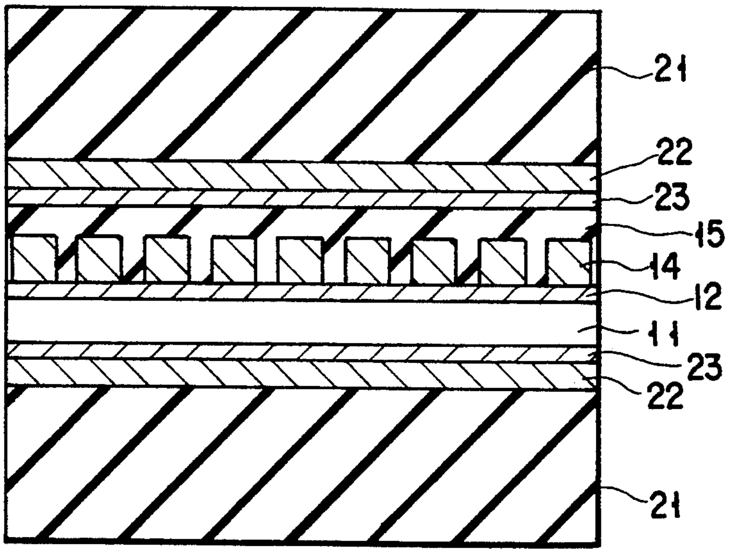

As shown in FIG. 7B, the Si substrate 11 having a planar coil is sandwiched by the two MgO substrates 21 each having a magnetic film, and they are adhered with each other, thereby manufacturing a planar inductor.

Figure 8:
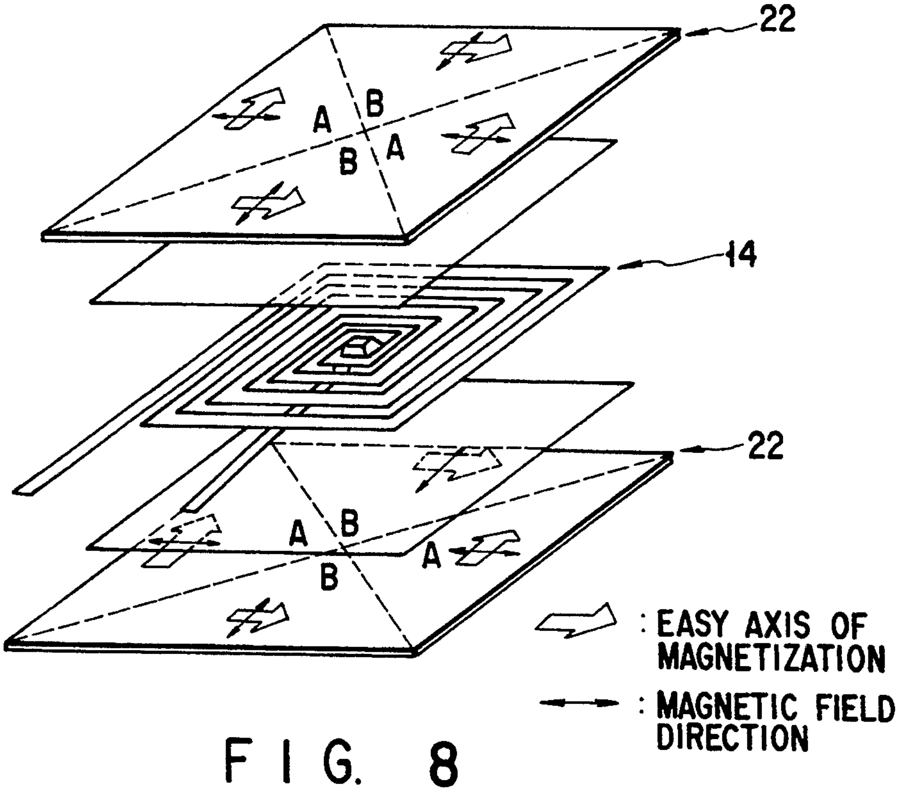
FIG. 8 is a view for explaining the directional relationship between a magnetic flux generated by a coil and the easy axis of magnetization of a magnetic film in the planar inductor in Example 1 of the present invention.

Since the easy axis of magnetization of the Fe film corresponds to the <100> direction, the direction of magnetic flux generated by the spiral coil 14 corresponds to the hard axis of magnetization of the magnetic film 22 in the arrangement of the coil and the magnetic films in this example as shown in FIG. 8. Therefore, a magnetization process is performed by only a so-called magnetization rotation.

Figure 9:
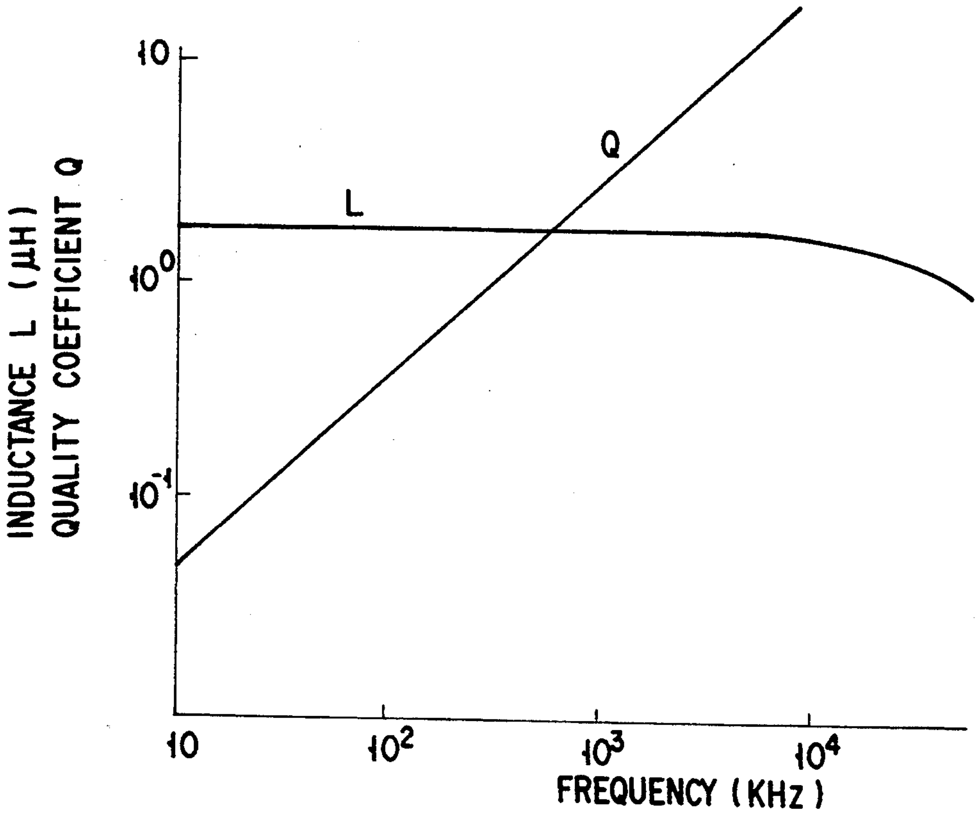
FIG. 9 is a graph showing the frequency characteristics of the inductance and quality coefficient of the planar inductor in Example 1 of the present invention.
Figure 10:
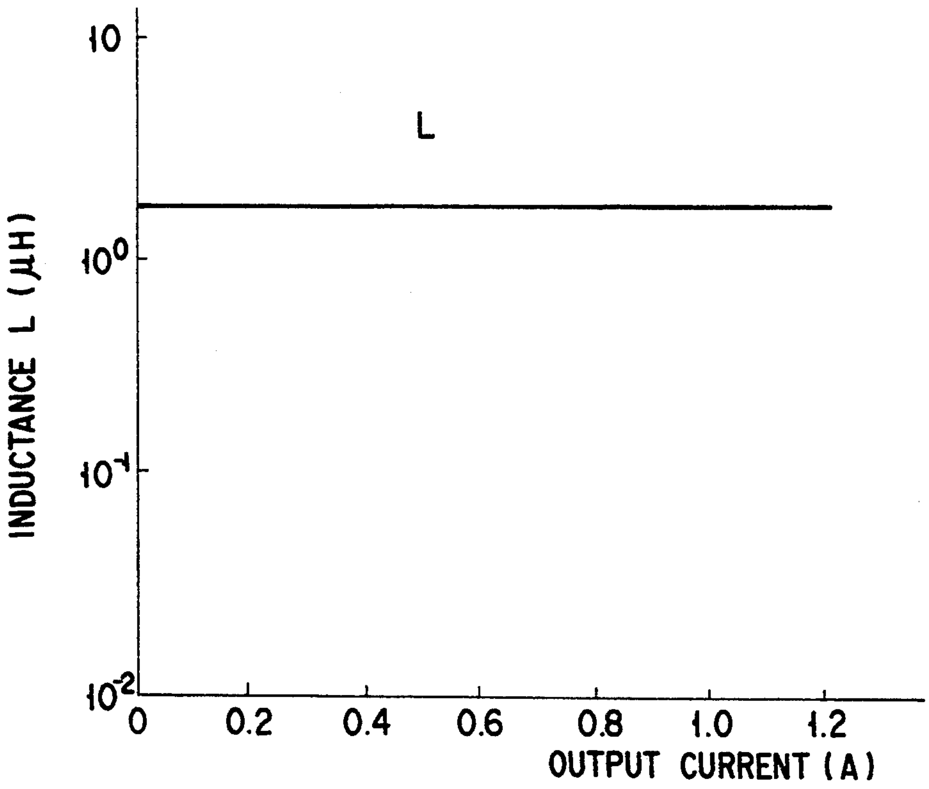
FIG. 10 is a graph showing the output current dependency (DC superposition characteristic) of the inductance of the planar inductor in Example 1 of the present invention.

The frequency characteristics of the inductance and quality coefficient of the planar inductor of this example are shown in FIG. 9, and the output current dependency (DC superposition characteristic) of the inductance of the inductor is shown in FIG. 10.

EXAMPLE 2

Figure 11A:
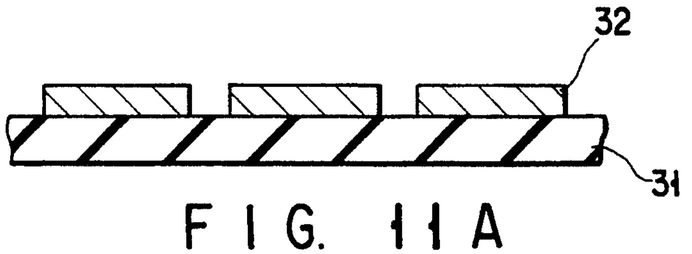
FIGS. 11A to 11C are sectional views showing the steps in manufacturing a planar inductor in Example 2 of the present invention.

As shown in FIG. 11A, a Cu foil is adhered on a polyimide film 31, and a 7-mm square meander coil 32 having a line/space =200 μm/50 μm is formed by wet etching.

Figure 11B:
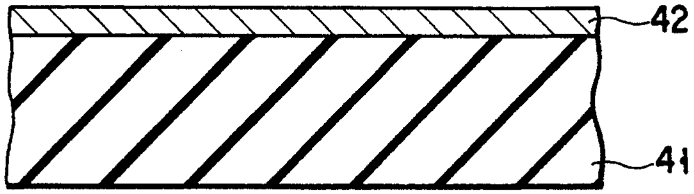

As shown in FIG. 11B, a glass substrate 41 is used as another substrate, and an amorphous CoZrNb film 42 having a thickness of 2 μm is formed on the substrate 41 by sputtering. The resultant structure is cut into 8-mm square. The substrate is annealed in a magnetic field of 1 kOe at 450° C. for 20 minutes, thereby introducing a magnetic anisotropy of 10 Oe to the substrate in a direction of applied magnetic field.

Figure 11C:
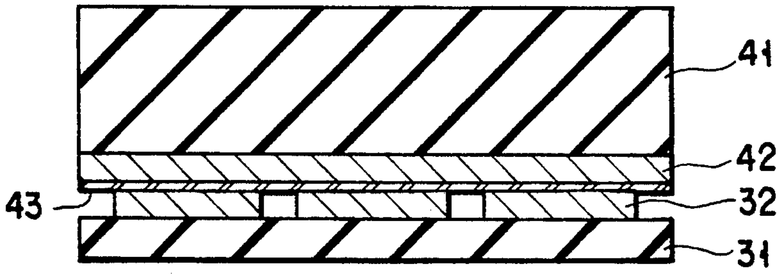

As shown in FIG. 11C, the polyimide film 31 having the coil and the glass substrate 41 having the magnetic film are arranged such that the magnetic flux generated by the coil is perpendicular to the direction of the magnetic anisotropy, and the polyimide film 31 is adhered to the glass substrate 41 through a polyimide film 43, thereby manufacturing a planar inductor.

Figure 12:
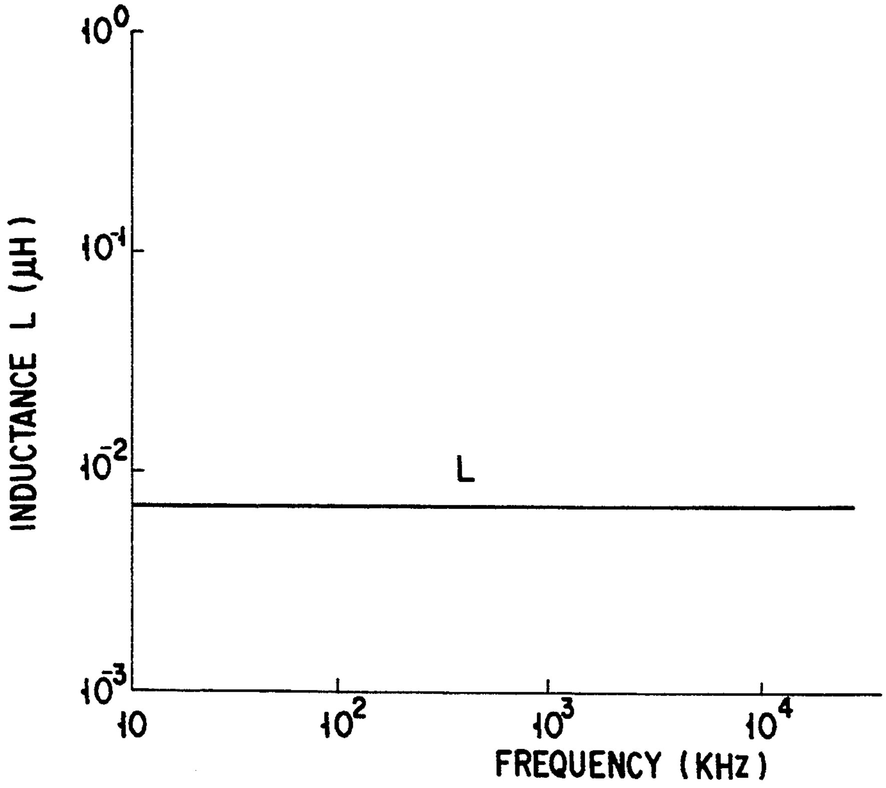
FIG. 12 is a graph showing the frequency characteristic of the inductance of the planar inductor in Example 2 of the present invention.

The frequency characteristic of the inductance of the planar inductor in this example is shown in FIG. 12.

EXAMPLE 3

Figure 13A:
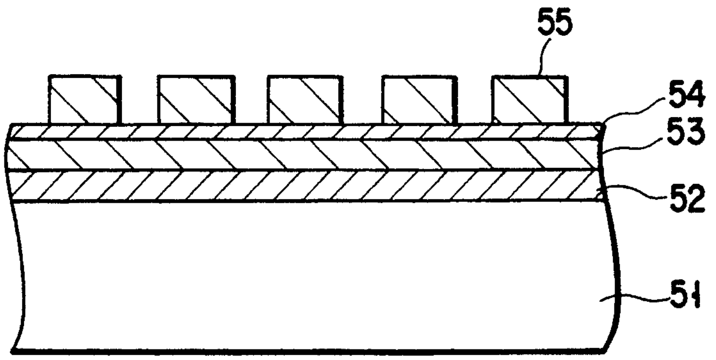
FIGS. 13A to 13C are sectional views showing the steps in manufacturing a planar inductor in Example 3 of the present invention.

As shown in FIG. 13A, a single crystalline MgO film 52 having a thickness of 1 μm is formed on an Si substrate 51 by vacuum deposition. The MgO film has a surface of (100) plane. A single crystalline Fe film 53 having a thickness of 2 μm is formed thereon by an ion-beam method. An $SiO_2$ film 54 is formed thereon by sputtering. Further, an Al film is formed on the $SiO_2$ film 54 by sputtering. The Al film is patterned by a micropatterning technique to form a spiral coil 55.

Figure 13B:
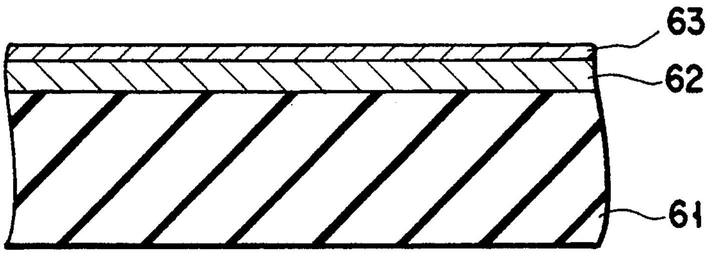

As shown in FIG. 13B, a single crystalline MgO substrate 61 is used as another substrate, and a single crystalline Fe film 62 is formed thereon by sputtering. In addition, an MgO film 63 is formed thereon by sputtering.

Figure 13C:
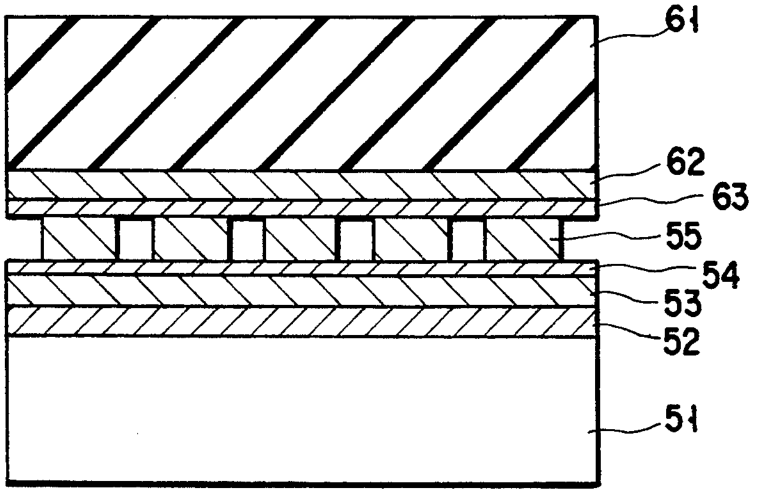

As shown in FIG. 13C, the Si substrate 51 having the coil and the MgO substrate 61 having the magnetic film are adhered to each other while the same positional relationship as that of Example 1 is kept, thereby manufacturing a planar inductor.

Figure 14:
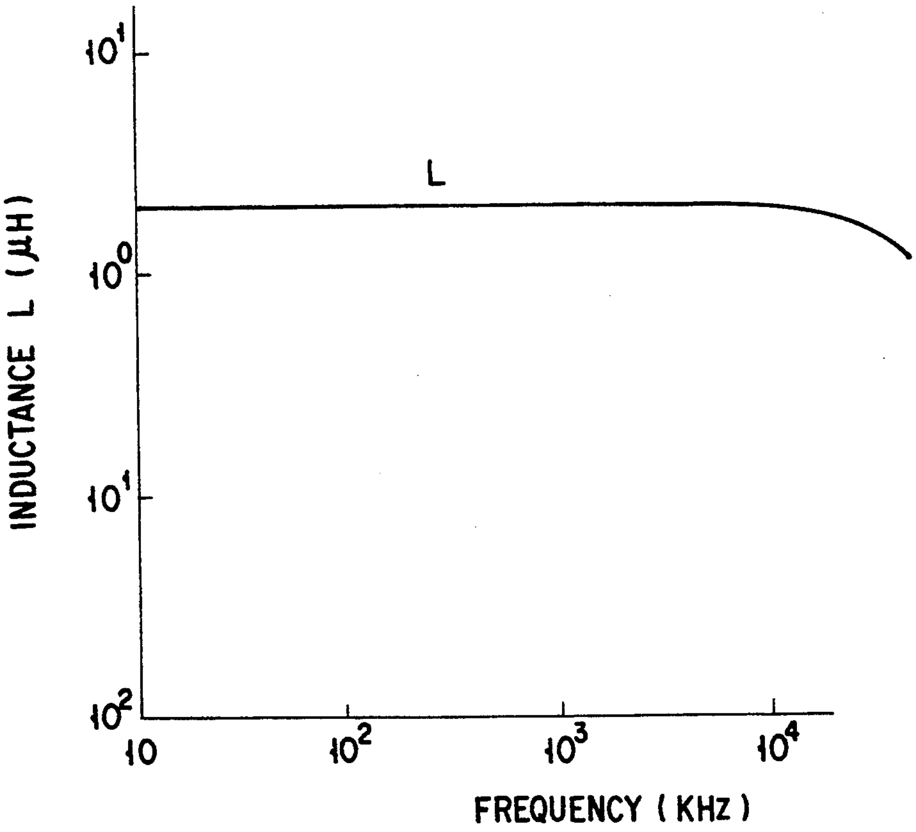
FIG. 14 is a graph showing the frequency characteristic of the inductance of the planar inductor in Example 3 of the present invention.

The frequency characteristic of the inductance of the planar inductor of the Example 3 is shown in FIG. 14.

Figure 15:
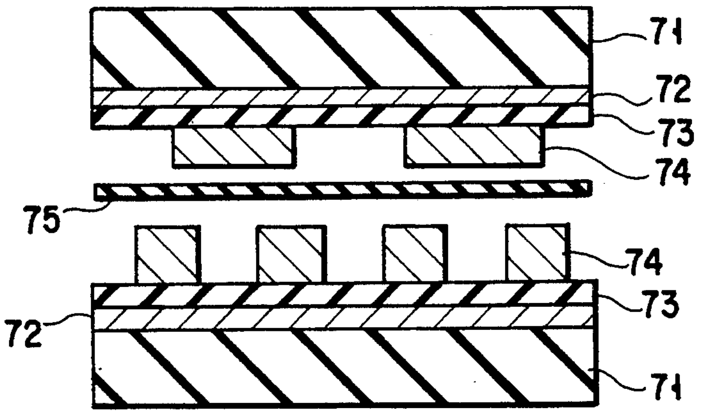
FIG. 15 is a sectional view showing a planar transformer in another example of the present invention.

When the present invention is used, various planar inductance elements such as a planar transformer shown in FIG. 15 and a composite element of a planar inductor and a planar transformer can be easily manufactured at low cost.

The planar transformer shown in FIG. 15 is manufactured as follows. CoZrNb/$SiO_2$ multilayered films 72, $SiO_2$ films 73, and Cu coils 74 (having the different numbers of turns) are formed on two AlN substrates 71, respectively, and the two resultant substrates are adhered to each other through a polyimide film 75.

Figure 16:
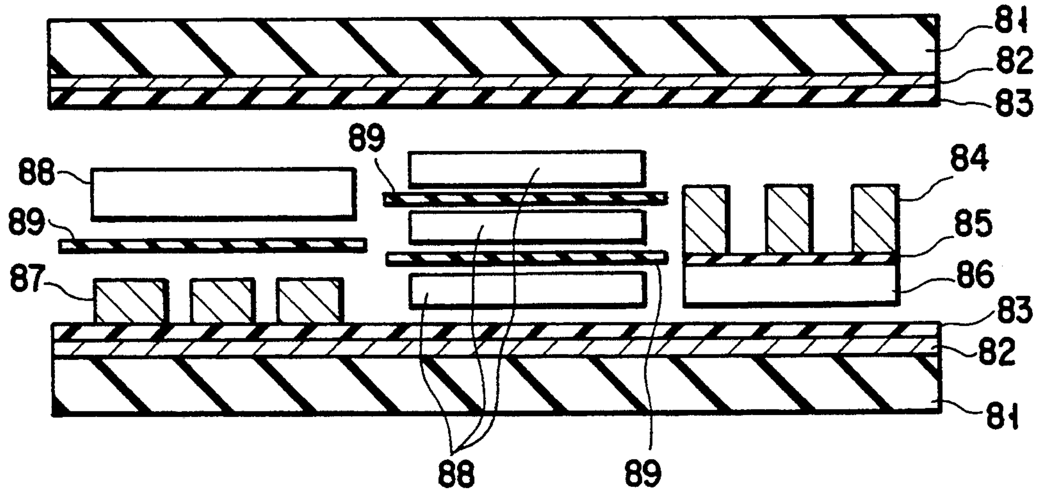
FIG. 16 is a sectional view showing a composite element of a planar inductor and a planar transformer in still another example of the present invention.

In a composite element shown in FIG. 16, two $Al_2O_3$ substrates 81 respectively having a ferrite film 82 and an $SiO_2$ film 83 are used. An Al coil 87 is additionally formed on a portion of the $SiO_2$ film 83 of one substrate. Members constituting various elements are interposed between the two substrates 81. For example, an Al coil 84 formed on an Si substrate 86 through an $SiO_2$ film 85 is interposed between the two substrates 81. In addition, three Cu slice coils 88 stacked through polyimide films 89 are interposed between the two substrates 81. A Cu slice coil 88 and a polyimide film 89 are interposed between the two substrates 81 at a portion corresponding to the portion where the Al coil 87 is formed.

What is claimed is:

1. A method of manufacturing a planar inductance element, comprising the steps of:
 forming a planar coil;
 forming a magnetic film on a substrate; and
 adhering said planar coil and said substrate to one another such that said magnetic film on said substrate faces said planar coil.

2. A method according to claim 1, wherein said substrate is a semiconductor substrate.

3. A method according to claim 1, wherein a magnetic film, an insulating film, and a planar coil are sequentially formed on a first substrate, and an insulating film and a magnetic film are sequentially formed on a second substrate.

4. A method according to claim 2, wherein a magnetic film, an insulating film, and a planar coil are formed on a first semiconductor substrate on which an active element is formed.

5. A method according to claim 1, wherein said substrate consists of an organic material.

6. A method according to claim 1, wherein said substrate is comprised of an insulating tape.

7. A method according to claim 3, wherein a plurality of planar coils are stacked on said first substrate.

8. A method according to claim 3, wherein said magnetic film, said insulating film, and a primary planar coil are sequentially formed on said first substrate, said insulating film and said magnetic film are sequentially formed on said second substrate, and an insulating film and a secondary planar coil are sequentially formed on said magnetic film.

9. A method according to claim 1, wherein said planar coil and said substrate are adhered to one another via an insulating layer.

10. A method according to claim 1, wherein said planer inductance element comprises a transformer.

11. A method of manufacturing a planar inductance element, comprising the steps of:

sequentially forming a first thermal oxide film, a magnetic film by sputtering, and a first insulating interlayer on a first semiconductor substrate;

forming planar coils on said first insulating interlayer by photolithography after a conductive film is formed thereon by sputtering;

forming a second insulating interlayer which contacts portions of said first insulating interlayer that are not covered by lines of said planar coils, and which covers an upper surface of said lines to thereby form a first semiconductor device on said first semiconductor substrate;

forming a second thermal oxide film on a second semiconductor substrate;

forming through holes in said second semiconductor substrate at positions corresponding to terminal positions of said planar coils formed on said first insulating interlayer;

burying a metal electrode within said through holes;

forming a magnetic film on said second thermal oxide film by sputtering to thereby form a second semiconductor device on said second semiconductor substrate; and adhering said first semiconductor device and said second semiconductor device to one another such that said second insulating interlayer contacts said second thermal oxide film.

12. A method according to claim 11, wherein an insulating film and a planar coil are formed on said magnetic film formed on said second semiconductor substrate.

13. A method according to claim 11, wherein said semiconductor substrate is formed of silicon.

14. A method according to claim 11, wherein said planer inductance element comprises a transformer.

* * * * *